(12) United States Patent
Opastrakoon et al.

(10) Patent No.: US 11,984,174 B2
(45) Date of Patent: May 14, 2024

(54) ACCELERATING CONFIGURATION UPDATES FOR MEMORY DEVICES

(71) Applicant: Micron Technology, Inc., Boise, ID (US)

(72) Inventors: Tawalin Opastrakoon, Boise, ID (US); Renato C. Padilla, Folsom, CA (US); Vamsi Pavan Rayaprolu, San Jose, CA (US); Sampath K. Ratnam, Boise, ID (US); Michael G. Miller, Boise, ID (US); Gary F. Besinga, San Jose, CA (US); Christopher M. Smitchger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 268 days.

(21) Appl. No.: 17/249,448

(22) Filed: Mar. 2, 2021

(65) Prior Publication Data
US 2022/0284974 A1 Sep. 8, 2022

(51) Int. Cl.
*G11C 16/06* (2006.01)
*G11C 16/10* (2006.01)
*G11C 16/26* (2006.01)
*G11C 16/34* (2006.01)

(52) U.S. Cl.
CPC .......... *G11C 16/3468* (2013.01); *G11C 16/10* (2013.01); *G11C 16/26* (2013.01); *G11C 16/3459* (2013.01)

(58) Field of Classification Search
CPC ... G11C 16/0483; G11C 29/028; G11C 16/10; G11C 11/5628; G11C 16/3468; G11C 16/26; G11C 16/3459; G11C 11/5642; G11C 16/3418; G11C 16/349; G11C 29/021; G11C 29/023
See application file for complete search history.

(56) References Cited

U.S. PATENT DOCUMENTS

| | | | |
|---|---|---|---|
| 10,014,056 B1* | 7/2018 | Lee | G11C 29/028 |
| 2009/0044085 A1* | 2/2009 | Zeng | G11C 29/82 |
| | | | 714/E11.002 |
| 2012/0239858 A1* | 9/2012 | Melik-Martirosian | |
| | | | G06F 11/076 |
| | | | 711/E12.008 |
| 2016/0217857 A1* | 7/2016 | Paudel | G11C 16/10 |
| 2019/0102262 A1* | 4/2019 | Sukhomlinov | G06F 11/1469 |
| 2022/0004525 A1* | 1/2022 | Graves, Jr. | G06F 3/065 |

* cited by examiner

*Primary Examiner* — Uyen Smet
(74) *Attorney, Agent, or Firm* — LOWENSTEIN SANDLER LLP

(57) ABSTRACT

A configuration setting manager of a memory device receives a request to perform an adjustment operation on a set of configuration setting values for the memory device, where each configuration setting value of the set of configuration setting values is stored in a corresponding configuration register of a set of configuration registers; determines a configuration adjustment definition associated with one or more configuration setting values of the set of configuration setting values; calculates an updated set of configuration setting values by applying a multiplier value to the configuration adjustment definition, wherein the multiplier value is associated with a number of programming operations performed on the memory device; and stores the updated set of configuration setting values in the corresponding configuration registers.

19 Claims, 5 Drawing Sheets

ACCELERATING CONFIGURATION UPDATES FOR MEMORY DEVICES

TECHNICAL FIELD

Embodiments of the disclosure relate generally to memory sub-systems, and more specifically, relate to accelerating configuration updates for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
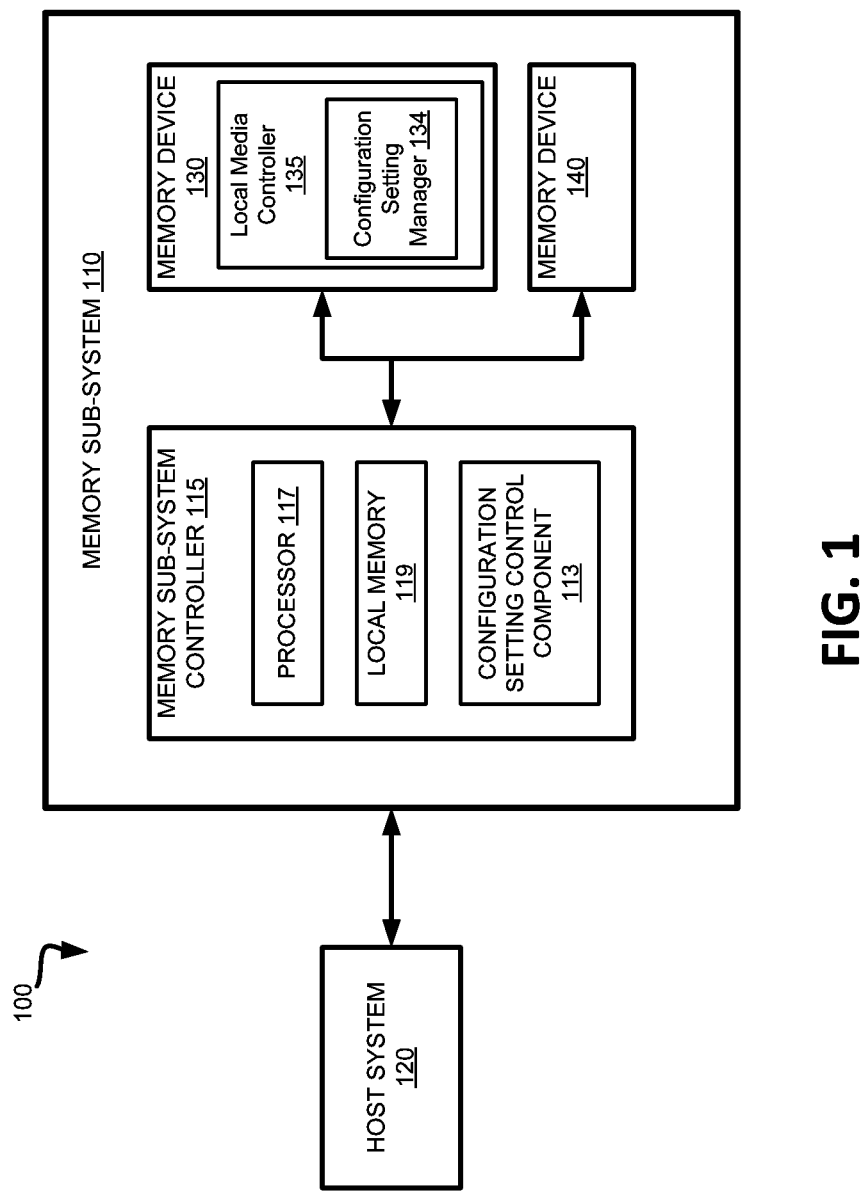
FIG. 1 illustrates an example computing system that includes a memory sub-system in accordance with some embodiments of the present disclosure.

Aspects of the present disclosure are directed to accelerating configuration updates for memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory sub-system controller can perform access operations on a memory device such as read operations, programming operations, erase operations, or the like. The memory device can include configuration settings (also referred to as "trim settings") that can control the operational and/or performance characteristics of the memory device. Trim settings can include a number of parameters that can control the operation and performance of the memory device. A trim setting configuration used by a memory device can control the operational characteristics of the memory device such that memory device can perform with (or closer to) desired operational characteristics than prior operational characteristics of the memory device. The memory device can include registers, buffers, and/or memory to store trim settings that define the trims for the data in memory device.

The trim settings can include parameters such as the programming signal magnitude (e.g., voltage and/or current level), erase signal magnitude (e.g., voltage and/or current level), sensing signal magnitude (e.g., voltage and/or level), programming signal length, erase signal length, sensing signal length, number of bits per cells, number of programming signals in a programming operation, number of sensing signals in a sensing operation, allowable programming operation rate for a memory device, or other similar information. In some instances, the operational characteristics of the memory device can include life span of the memory device, data retention characteristics for the data in the memory device, the storage density (e.g., the number of bits stored) for the memory device, disturb characteristics for the data in the memory device, programming speed for the memory device, power consumption for the memory device, sensing speed for the memory device, operation temperature for the memory device, and/or programming operation rate for the memory device, or the like.

For example, when reading a memory cell of a selected access line of a block of memory cells, conventional systems provide different voltages to unselected access lines of that block of memory cells based on their relative location to the selected access line. The trim setting associated with the read operation can specify the voltages to be used for the unselected access lines and the selected access line.

In conventional memory sub-systems, usage of a memory device over time can lead to changes in threshold voltage levels of and/or an amount of charge stored in the memory cells, which in turn can result in reliability and performance degradation as the memory device ages. To address this, conventional memory sub-systems can adjust trim settings over time to account for these changes in order to maintain performance and reliability of the memory device. In such implementations, the memory sub-system controller can modify the trim values by reading the trim value from the memory device, adjusting the value, and rewriting the trim value back to the memory device. In many instances, however, this process can itself lead to negatively impacting the operation of the memory device. In cases where the memory device is configured with a large number of trim values, the conventional process can result in repetitive read-modify-write iterations to be performed for each trim value on the memory device. This can lead to an increase in time to ready (TTR) during power up, a significant reduction in performance immediately during the adjustment cycle as well as over the life of the device, and an increase in risk of error as a result of an interrupted trim update. Moreover, the added communications between the memory sub-system controller and the memory device can result in added wear to the device, which can further reduce the operational life of the memory device.

Conventional memory sub-systems attempt to mitigate these issues by limiting the adjustments made to trim values. This, however, can result in non-uniform trim adjustment across memory devices in a memory sub-system as well as a reduction in performance and/or reliability for a particular memory device.

Aspects of the present disclosure address the above and other deficiencies by accelerating configuration updates to memory devices. In one embodiment, a configuration setting control component of the memory sub-system controller can monitor programming operations performed on the memory cells of a memory device. When the number of programming operations satisfies a threshold criterion associated with the trim settings of the memory device, the configuration setting control component can determine that the trim settings are to be adjusted. In response, the configuration setting control component can send a single request to update the trim settings for the device. The trim settings can be configured such that each setting is associated with an adjustment definition that can be used to update that setting. The request sent by the configuration setting control component can include a multiplier value calculated by the memory sub-system controller that can be applied to each adjustment definition to update the trim settings for the memory device.

Advantages of the present disclosure include, but are not limited to, simplification and acceleration of the configuration setting update process. Utilizing a single request to cause a memory device to perform multiple configuration setting updates significantly reduces the number read-update-write operations performed by conventional systems. This, in turn, reduces the wear on the memory device which can significantly improve the performance and reliability over time. Additionally, by reducing the read-update-write operations, the number of adjustment operations performed on the memory device can be maintained at optimal levels, thereby eliminating the need to reduce or limit the number adjustments performed or the number of settings adjusted. This, in turn, can provide maximum benefit from trim adjustments without the typical performance and/or reliability costs experienced by conventional systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 can include a configuration setting control component 113 that can be used to control accelerated updates to configuration settings for memory device 130. In some embodiments, the memory sub-system controller 115 includes at least a portion of the configuration setting control component 113. In some embodiments, the configuration setting control component 113 is part of the host system 110, an application, or an operating system. In other embodiments, local media controller 135 includes at least a portion of configuration setting control component 113 and is configured to perform the functionality described herein.

In various implementations, configuration setting control component 113 can monitor the number of programming operations (e.g., program/erase cycles) performed on the memory cells of memory devices 130, 140. Memory device 130 can be configured with one or more configuration settings (e.g., trim settings) that can be used to manage the operational and/or performance characteristics of the memory device 130. Configuration setting control component 113 can be configured to send a single request to memory device 130 to cause memory device 130 to update its configuration settings. In some implementations, configuration setting control component 113 can determine when to send this request based on the number of programming operations performed on memory device 130. If the number of programming operations satisfies a threshold criterion associated with the trim settings, configuration setting control component 113 can send the request to memory device 130.

In some implementations, the request can include additional information to be used by the memory device to complete the updates to the configuration settings. In one example, the request can include a multiplier value calculated by configuration setting control component 113 based on the number of programming operations performed. As described in further detail below, the multiplier value can be used by memory device 130 to update its configuration settings. In another example, the request can include the number of programming operations performed, which can be used by the memory device 130 to update its configuration settings. Further details with regards to the operations of the configuration setting control component 113 are described below with respect to FIG. 4.

In one embodiment, the local media controller 135 can include a configuration setting manager 134 to facilitate the accelerated update of the configuration settings on memory device 130. In various implementations, configuration setting manager 134 can configure the configuration settings for memory device 130 such that each setting is associated with a configuration adjustment definition that specifies how a configuration setting is to be updated. As described in further detail below, a configuration adjustment definition can include a polynomial equation that includes multiple operands, where at least one operand can be modified by the multiplier value indicated in the request received from the configuration setting control component 113 to perform the adjustment operation.

The configuration setting manager 134 can, responsive to receiving the request, apply the multiplier value to the configuration adjustment definitions to calculate an updated set of configuration settings for memory device 130. The updated settings can subsequently be stored in registers or memory spaces dedicated to those settings. Thus, a single request received from configuration setting control component 113 can cause configuration setting manager 134 to update all (or a group of) trim settings for memory device 130. Further details with regards to the operations of the configuration setting manager 134 are described below with respect to FIG. 2.

Figure 2:
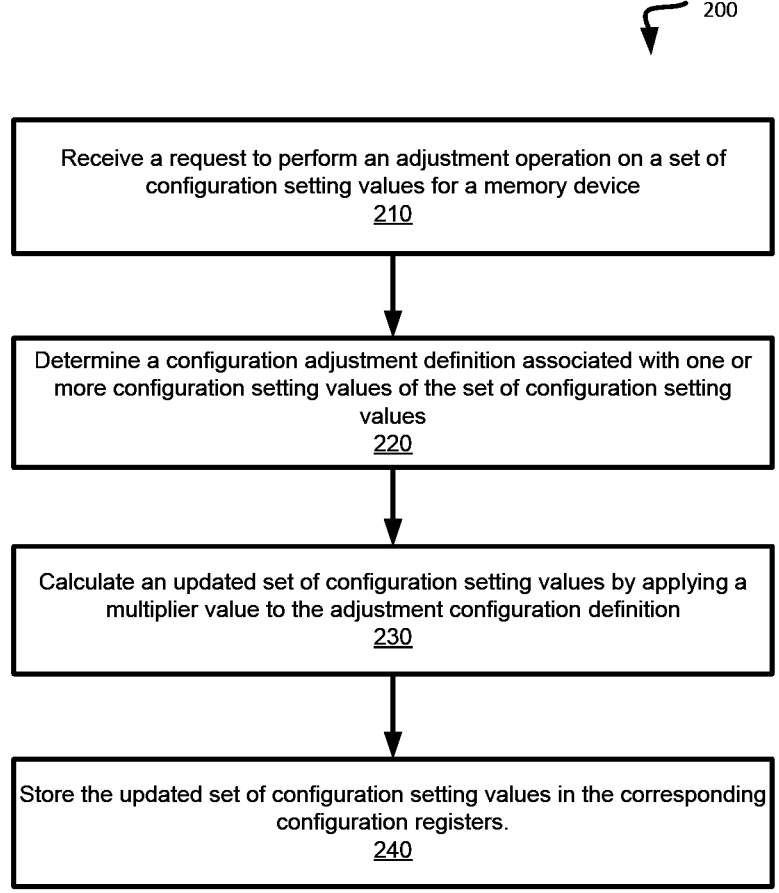
FIG. 2 is a flow diagram of an example method to facilitate accelerating configuration updates for memory devices in accordance with some embodiments of the present disclosure.

FIG. 2 is a flow diagram of an example method 200 to facilitate accelerating configuration updates for memory devices, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the configuration setting manager 134 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a request to perform an adjustment operation on a set of configuration setting values for a memory device (e.g., memory device 130 in FIG. 1). As noted above, configuration setting values can be implemented as trim values stored in trim registers for a memory device. In various implementations, the configuration settings can be used to customize access operations of the memory device. Also as noted above, a firmware or control component of a memory sub-system controller (e.g., a configuration setting control component 113 of memory sub-system controller 115 in FIG. 1) can control the adjustment of the configuration settings during the lifetime of a memory device based on determined ranges of programming operations (e.g., program/erase cycles) performed on the memory device. These adjustments can be performed to maintain the performance and reliability of the memory device as the device ages.

In various implementations, the request can be received from the firmware component of the memory sub-system controller associated with the memory device. As noted above, the memory sub-system controller can monitor the program erase cycles performed on the memory device to determine when the configuration setting values should be adjusted. In some implementations, the request can specify which configuration settings (e.g., which trim settings) are to be adjusted in response to the request. For example, the request can specify that all configuration setting values (e.g., all trim settings) are to be adjusted responsive to receiving the request. Alternatively, the request can specify that a subset of the configuration setting values are to be adjusted. In this latter instance, the configuration setting values can be configured in groups, where each group is associated with a unique identifier. The configuration setting control component of the memory sub-system can include the unique identifier in the request to indicate which group of configuration settings are to be adjusted. Responsive to receiving the request, the processing logic can determine which configuration setting values are to be adjusted in view of the format of the request.

At operation 220, the processing logic determines a configuration adjustment definition associated with one or more configuration setting values of the set of configuration setting values. In some implementations, a configuration adjustment definition can specify the parameters for performing the adjustment operation to the configuration setting value(s) that are specified in the request. In an illustrative example, the configuration adjustment definition can be configured as a polynomial equation that includes multiple operands used to calculate a final configuration setting value. For example, one type of configuration adjustment definition can include one operand representing a default setting and a second operand representing an incremental change value associated with an expected slope of change for the configuration setting with respect to the number of programming operations performed over time.

In some implementations, one of the operands can be modified by a multiplier value that is associated with the number of programming operations performed at a particular point in time. In such instances, an exemplary adjustment definition could be represented as the product of the incremental value and the multiplier, then added to the default value. In other words an equation such as VALUE=DEFAULT VALUE+(INCREMENTAL VALUE*MULTIPLIER VALUE). While for ease of illustration one particular definition has been described, in other implementations, other configuration adjustment equation definitions could be specified that include more or fewer operands that are related to performing and adjustment to that particular configuration setting. In various implementations, a single multiplier can be used to direct the adjustment for multiple (or all) adjustment definitions for a memory device as described below with respect to operation 230.

In various implementations, the operands of an adjustment definition could be specified as constant values within the definition. Alternatively, the operands could be associated with separate stored configuration setting values (e.g., other trim setting values) that can be modified by the processing logic based on observed behavior of the memory device. For example, to continue the above example, the value for the INCREMENTAL VALUE operand can be stored in a separate trim register and can be modified over time based on observed behavior of the device. If the processing logic determines that the incremental change for the particular configuration setting is not in line with expected performance for the drive, the processing logic can modify the trim setting for that operand to account for any observed deviation. For example, if the definition equation is associated with a configuration setting for read operations, the equation can be directed to a voltage level value associated with performance of the read operation. Over time, if observed voltage levels for the memory cells of the device are degrading or drifting at an unexpected rate, the processing logic can modify the value stored in the trim setting for the INCREMENTAL VALUE operand as an adjustment.

In various implementations, each configuration setting value can be associated with a specific configuration adjustment definition that is configured to adjust that particular setting. In other words, each trim setting can have a corresponding adjustment definition that can be used to direct an adjustment operation for that particular trim setting. In other implementations, a group of configuration setting values can be associated with a single adjustment definition. In such instances the same adjustment definition can be used to adjust multiple configuration setting (e.g., multiple trim settings).

At operation 230, the processing logic calculates an updated set of configuration setting values by applying a multiplier value to the configuration adjustment definition. As noted above, the configuration adjustment definition can include an operand that is modified by the multiplier value. In various implementations, the multiplier value can be associated with the number of programming operations (e.g., the number of program erase cycles) performed on the memory device. The multiplier value can be set to a different value depending on the total number of programming operations at a particular point in time. In one example, as the number of programming operations performed increases, the multiplier value can increase to adjust the configuration setting value appropriately. For example, after 750 programming operations are performed, the multiplier value can be set to 2. Following the definition example described above, this would result in the incremental value being increased by a factor of 2. Subsequently, after 1200 programming operations are performed, the multiplier value can be set to 5. In other examples, other combinations of programming operations and multiplier values can be used.

In some implementations, the multiplier value can be included in the request received at operation 210. As noted above, the configuration setting control component of the memory sub-system controller can monitor the number of programming operations performed and make the determination of when to send the request to perform the adjustment. When making this determination, the configuration setting control component can also determine the multiplier value to send in the request. In such instances, processing logic can apply the multiplier value in the request to the adjustment definition equations to calculate an updated configuration setting value (or set of updated configuration setting values). Notably, a single request can drive the adjustment of multiple configuration setting values using the same multiplier value.

In other implementations, the processing logic can calculate the multiplier responsive to receiving the request. In such instances, the request received at operation 210 can include information indicative of the number of programming operations performed for the memory device. For example the request can include the number of programming operations. In such instances, the processing logic can access a predefined mapping that maps a number of programming operations to a corresponding multiplier value. Alternatively, the request can include a value that indicates a range of programming operations performed (e.g., '1' represents 500 or fewer, '2' represents 501 to 750, '3' represents 751 to 1000, and so on). In such instances, processing logic can determine whether the number of programming operations in the request has satisfied a threshold that indicates that an adjustment should be performed on the configuration setting value. If the threshold has been satisfied, processing logic can calculate the multiplier value to be used for the applicable configuration adjustment definition based on the information received in the request. As noted above, once the single multiplier value has been calculated, it can be used to direct the adjustment of multiple configuration setting values.

At operation 240, the processing logic stores the updated set of configuration setting values in the corresponding registers. As noted above, each configuration setting value (e.g., each trim value) can be stored in a dedicated register for that setting value (e.g., a dedicated trim register). Accordingly, the adjustment operation can utilize the adjustment definition equations associated with each configuration setting value to update the value stored in each register.

Figure 3:
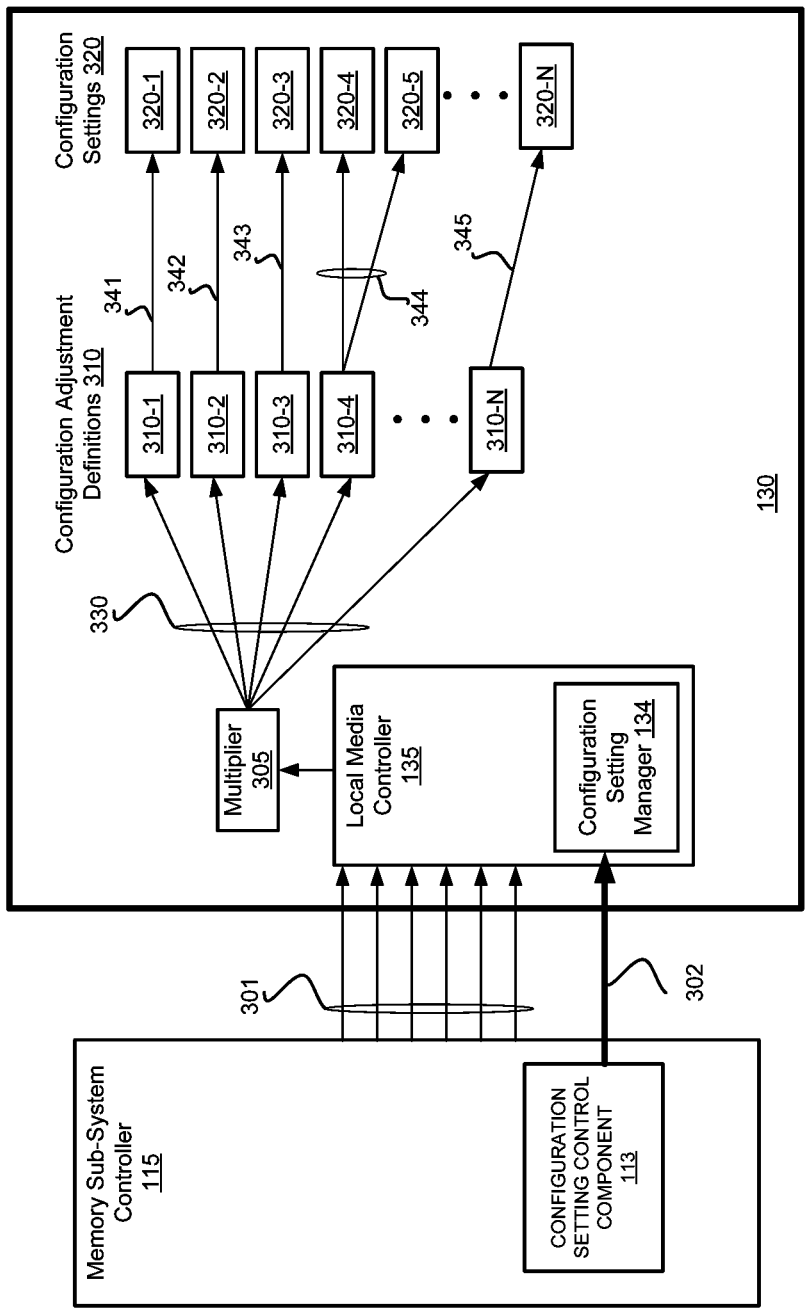
FIG. 3 illustrates a simplified block diagram of a memory device in communication with a memory sub-system controller of a memory sub-system to facilitate accelerating configuration updates for the memory device, in accordance with some embodiments of the present disclosure.

FIG. 3 illustrates a simplified block diagram of a memory device 130 (e.g., memory device 130 of FIG. 1) in communication with a memory sub-system controller 115 of a memory sub-system (e.g., memory sub-system 110 of FIG. 1) to facilitate accelerating configuration updates for the memory device 130, in accordance with some embodiments of the present disclosure. The memory sub-system controller 115 (e.g., a controller external to the memory device 130), can be a memory controller or other external host device that can include a configuration setting control component 113 that monitors access operations performed on memory device 130 and determining when to send a request to memory device 130 to adjust configuration settings stored on the memory device 130.

As shown in FIG. 3, the local media controller 135 internal to the memory device 130 controls access to the memory cells of the memory device (not pictured) in response to commands received from memory sub-system controller 115. The local media controller 135 is configured to perform access operations (e.g., read operations, programming operations, erase operations, etc.) on the memory cells of memory device 130 as well as configuration adjustment operations on the memory device 130. As shown, memory device 130 can be configured with configuration settings (e.g., trim settings) 320-1 to 320-N, where N is a positive integer. In various implementations, as described above with respect to FIGS. 1-2, configuration settings 320-1 to 320-N can be used to customize the access operations for the memory cells of memory device 130.

Also as described above, memory device 130 can be configured with multiple configuration adjustment definitions 310 that can be used to perform adjustment operations on configuration settings 320. In some implementations, each configuration setting 320 can be associated with a corresponding configuration adjustment definition 310. In such instances the configuration adjustment definition 310 can be used to update a single configuration setting 320. For example, as shown in FIG. 3, configuration adjustment definition 310-1 can be used to update configuration setting 320-1, configuration adjustment definition 310-2 can be used to update configuration setting 320-2, configuration adjustment definition 310-3 can be used to update configuration setting 320-3, and so on. In some implementations, a single configuration setting 310 can be used to update multiple configuration settings 320. For example, as shown, configuration adjustment definition 310-4 can be used to update configuration settings 320-4 and 320-5. While for ease of illustration, a particular mapping of configuration adjustment definitions 310 to configuration settings 320 is depicted in FIG. 3, in other implementations, memory device 130 can be configured with other mappings.

As shown, configuration setting control component 113 of memory subsystem controller 115 can monitor the access operations performed on memory device 130. In various implementations, as described above, configuration setting control component 113 can monitor programming operations 301 performed on memory device 130 until the number of operations satisfies a threshold criterion associated with the configuration setting values (e.g., trim settings). In one embodiment, the threshold criterion is satisfied with the number of operations performed meets or exceeds a threshold value. Thus, the threshold criterion remains unsatisfied when the number of operations performed is below the threshold value. When the threshold criterion has been satisfied, configuration setting control component 113 can send a request 302 to configuration setting manager 134 to adjust the configuration settings 320 of memory device 130. Notably, the single request 302 can cause configuration setting manager 134 to update multiple configuration settings 320 using information included in the request.

In various implementations, as described above, configuration setting control component 113 can include additional information in request 320 that can be used by configuration setting manager 134 to apply to the configuration adjustment definitions 310 to adjust the configuration settings 320. In some implementations, request 302 can include a multiplier value (e.g., multiplier 305) in the request. In such instances, configuration setting manager 134 can apply the multiplier directly to the configuration adjustment definitions 310 to update the configuration settings 320. In other implementations, request 302 can include the number of programming operations 301 performed, causing configuration settings manager 134 to calculate multiplier 305. Configuration setting control component 113 is described in further detail below with respect to FIG. 4.

As shown, configuration setting manager 134 receives request 302. Configuration setting manager 134 subsequently identifies the configuration settings to be updated and determines the configuration adjustment definitions 310 that are associated with those settings. As shown in FIG. 3, request 302 causes configuration setting manager 134 to adjust all configuration settings 320 to be updated. In other implementations (not shown), request 302 can specify a subset of configuration settings 320 to be updated. As shown, configuration setting manager 134 applies the multiplier 305 to each of the configuration adjustment definitions 310 (operation 330). As described above, the configuration adjustment definitions 310 can be polynomial equations that include multiple operations, where at least one of the operands is modified by the multiplier value. Operation 310 depicts the application of the multiplier value to the applicable configuration adjustment definition equations 310.

Subsequently, configuration setting manager 134 calculates an updated set of configuration settings 320 by applying the multiplier 305 to the applicable adjustment definitions 310. As shown, applying the multiplier to definition 310-1 updates configuration setting 320-1 (341), applying the multiplier to definition 310-2 updates configuration setting 320-2 (342), applying the multiplier to definition 310-3 updates configuration setting 320-3 (343), applying the multiplier to definition 310-4 updates configuration settings 320-4, and 320-5 (344), and applying the multiplier to definition 310-N updates configuration setting 320-N (345). Each updated configuration setting is subsequently stored in a register for that setting value.

In various implementations, the above process can be repeated by configuration setting control component 113 and configuration setting manager 134 as additional programming operations are performed on memory device 130, causing additional adjustment operations to be performed on the configuration settings 320.

Figure 4:
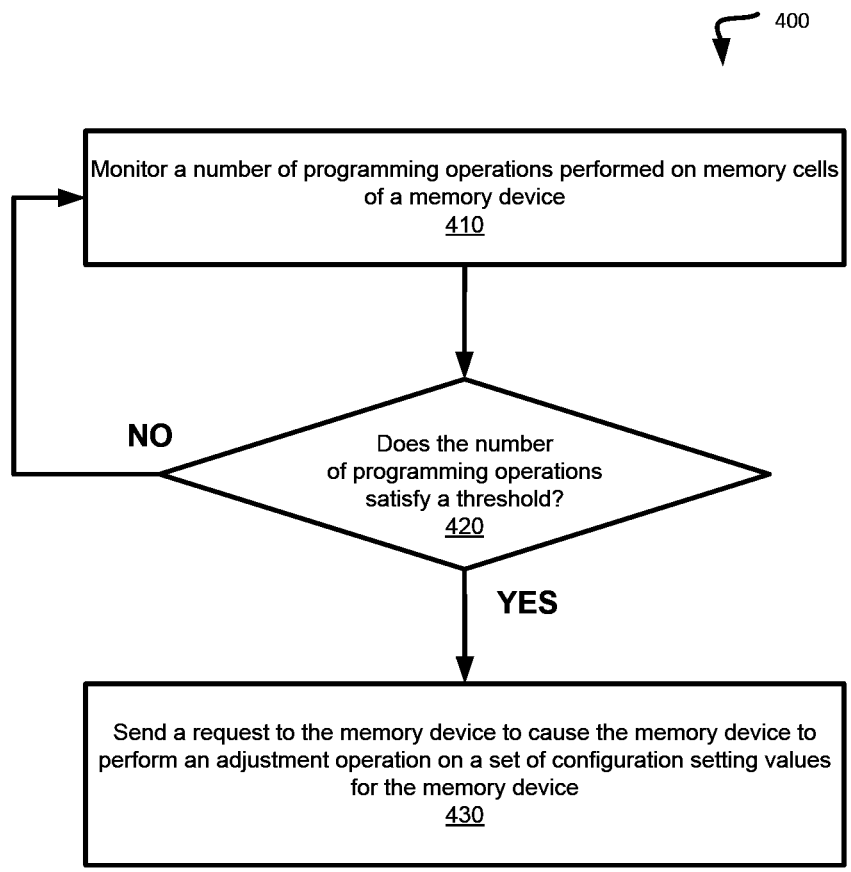
FIG. 4 is a flow diagram of an example method to control accelerating configuration updates for memory devices in accordance with some embodiments of the present disclosure.

FIG. 4 is a flow diagram of an example method 400 to control acceleration of configuration updates for memory devices, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the configuration setting control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic monitors a number of programming operations performed on memory cells of a memory device.

At operation 420, the processing logic determines whether the number of programming operations performed on the memory cells of the memory device satisfies a threshold criterion associated with the trim settings (e.g., meets or exceeds a threshold value). In various implementations, the threshold value can be configured to determine when an adjustment to the configuration setting values (e.g., the trim setting values) of the memory device should be adjusted. In one example, the threshold value can be configured so that it is satisfied after a particular number of program operations are performed. In such instances, a counter can maintain the number of operations performed and once the threshold has been satisfied, the counter can be reset to zero. In another example, the threshold value can be configured to indicate particular numbers of total programming operations performed. In these instances, the threshold can be satisfied when the total number of operations performed reaches 500, 750, 1000, 1250, etc. In other implementations, other monitoring threshold schemes can be used.

If, at operation 420, processing logic determines that the threshold criterion has not been satisfied, processing returns to operation 410 to continue monitoring the number of programming operations performed. If, however, processing logic determines that the threshold criterion has been satisfied, processing proceeds to operation 430.

At operation 430, responsive to determining that the number of programming operations performed on the memory cells of the memory device satisfies the threshold criterion, the processing logic sends a request to the memory device to cause the memory device to perform an adjustment operation on a set of configuration setting values (e.g., a group of trim settings) for the memory device. Notably, the single request causes the memory device to perform adjustment operations on multiple configuration setting values. As noted above, the request can include information to direct the memory device to apply a multiplier value to one or more configuration adjustment definition equations to perform the adjustment operations on the configuration setting values. Additionally, the request can include information to specify which configuration setting values are to be adjusted by the adjustment operation.

As noted above, in some implementations, processing logic can include in the request the number of programming operations performed on the memory device based on the monitoring performed at operation 410. In such instances, the memory device, after receiving the request, can determine the applicable multiplier value to be used for the adjustment operation. Alternatively, the request can include a value that indicates a range of programming operations performed (e.g., '1' represents 500 or fewer, '2' represents 501 to 750, '3' represents 751 to 1000, and so on). In these instances, the memory device can determine the applicable multiplier based on the value included in the request. In other implementations, the request can include the multiplier value itself. In such instances, processing logic can determine the multiplier value in view of the number of programming operations. As noted above, the processing logic can access a predefined mapping that maps a number of programming operations to a corresponding multiplier value. In these instances, the mapping can be configured based on characteristics associated with the memory device, the configuration of the memory cells, the expected usage of the memory device, or other similar information. In other implementations, the processing logic can apply a mathematical function to the number of programming operations to calculate the multiplier value.

In some implementations, the request can specify that the adjustment operation is to be performed on all configuration setting values for the memory device (e.g., all trim settings). Alternatively, the request can specify that the adjustment operation is to be performed on a subset of the configuration setting values for the memory device. In this latter case, the configuration setting values can be configured in groups, where each group is associated with a unique identifier. The processing logic can determine which group of configuration settings is to be adjusted and include the identifier for that group in the request to perform the adjustment operation. In various implementations, the processing logic can monitor the programming cycles and utilize different thresholds for different groups of configuration settings. In such instances, the processing logic can cluster groups of configuration settings (e.g., different groups of trim settings) based on functionality and trigger adjustment operations for groups differently based on different programming cycle thresholds.

Figure 5:
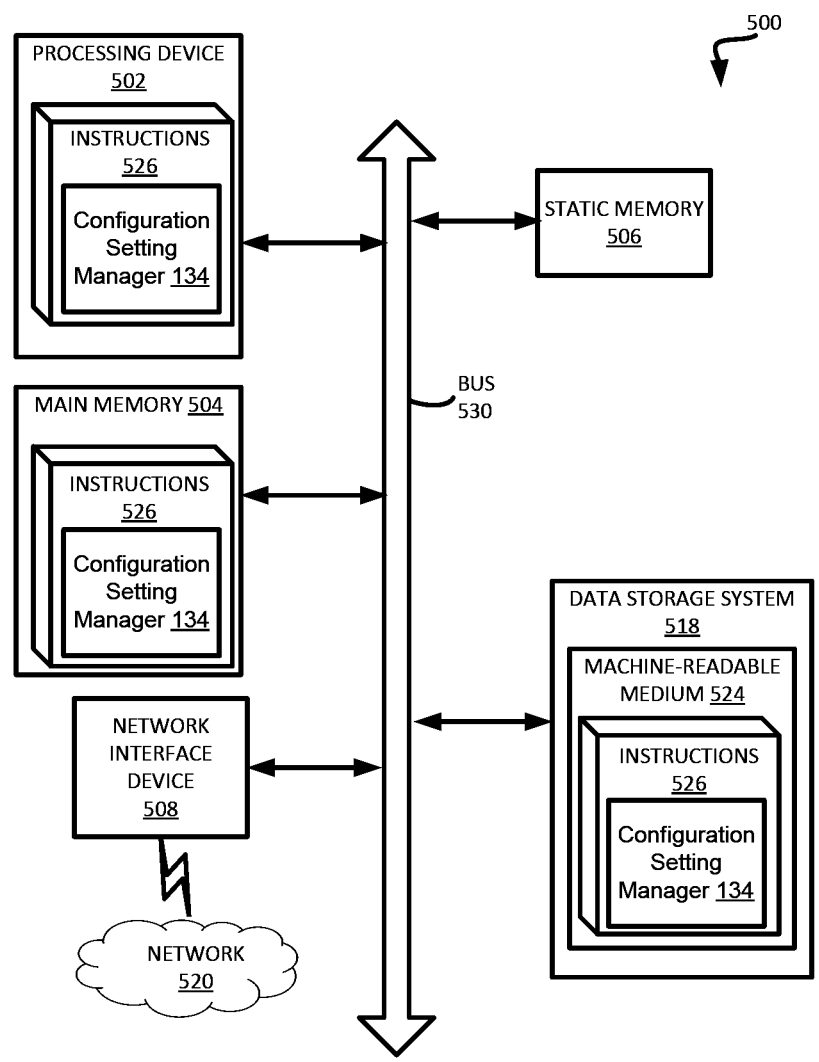
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the configuration setting manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 626 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a configuration setting manager (e.g., the configuration setting manager 134 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, by a processing device, a request to perform an adjustment operation on a set of configuration setting values for a memory device, wherein each configuration setting value of the set of configuration setting values is stored in a corresponding configuration register of a set of configuration registers;
determining a configuration adjustment definition associated with one or more configuration setting values of the set of configuration setting values;
calculating, by the processing device, an updated set of configuration setting values by applying a multiplier value to the configuration adjustment definition, wherein the multiplier value is associated with a number of programming operations performed on the memory device; and
storing the updated set of configuration setting values in the corresponding configuration registers.

2. The method of claim 1, wherein the request comprises an indication of the multiplier value.

3. The method of claim 1, wherein the request comprises the number of programming operations performed on the memory device, the method further comprising:
determining whether the number of programming operations satisfies a threshold criterion associated with the set of configuration setting values; and
responsive to determining that the number of programming operations satisfies the threshold criterion, calculating the multiplier value in view of the number of programming operations.

4. The method of claim 1, wherein determining the configuration adjustment definition associated with one or more configuration setting values of the set of configuration setting values further comprises:
determining a set of configuration adjustment definitions, wherein each configuration adjustment definition is associated with a corresponding configuration setting value of the set of configuration setting values; and calculating the updated set of configuration setting values by applying the multiplier value to each configuration adjustment definition.

5. The method of claim 1, wherein the request comprises an identifier associated with the set of configuration setting values, and wherein the set of configuration values comprises a subset of a total number of configuration setting values for the memory device.

6. The method of claim 5, further comprising:
determining the set of configuration setting values in view of the received identifier.

7. The method of claim 1, wherein the set of configuration values comprises a total number of configuration setting values for the memory device.

8. The method of claim 1, wherein the configuration adjustment definition is a polynomial equation comprising a plurality of operands, wherein a first operand of the plurality of operands comprises a default configuration setting value, wherein a second operand of the plurality of operand comprises an incremental change value associated with an expected slope of change for the configuration setting, and wherein the incremental change value is modified by the multiplier value.

9. A method comprising:
monitoring, by a processing device, a number of programming operations performed on memory cells of a memory device;
determining whether the number of programming operations performed on the memory cells of the memory device satisfies a threshold criterion associated with a set of configuration setting values for the memory device; and
responsive to determining that the number of programming operations performed on the memory cells of the memory device satisfies the threshold criterion, sending a request to the memory device to cause the memory device to perform an adjustment operation on the set of configuration setting values for the memory device, wherein the request comprises a value that indicates a respective range of the number of programming operations performed on the memory cells of the memory device, wherein the respective range represents a total number of programming operations between two range threshold values of a set of range threshold values.

10. The method of claim 9, further comprising:
determining a multiplier value in view of the range of the number of programming operations, wherein the multiplier value indicates an adjustment factor for the memory device to apply to an adjustment definition associated with the set of configuration setting values; and
sending an indication of the multiplier value to the memory device in the request.

11. The method of claim 9, wherein the request specifies that memory device is to perform the adjustment operation on all configuration setting values for the memory device.

12. The method of claim 9, wherein the request comprises an identifier associated with the set of configuration setting values, and wherein the set of configuration values comprises a subset of a total number of configuration setting values for the memory device.

13. A system comprising:
a memory device; and
a processing device, operatively coupled with the memory device to perform operations comprising:
receiving a request to perform an adjustment operation on a set of configuration setting values for a memory device, wherein each configuration setting value of the set of configuration setting values is stored in a corresponding configuration register of a set of configuration registers;
determining a configuration adjustment definition associated with one or more configuration setting values of the set of configuration setting values;
calculating an updated set of configuration setting values by applying a multiplier value to the configuration adjustment definition, wherein the multiplier value is associated with a number of programming operations performed on the memory device; and
storing the updated set of configuration setting values in the corresponding configuration registers.

14. The system of claim 13, wherein the request comprises an indication of the multiplier value.

15. The system of claim 13, wherein the request comprises the number of programming operations performed on the memory device, and wherein the processing device is to perform further operations comprising:
determining whether the number of programming operations satisfies a threshold; and
responsive to determining that the number of programming operations satisfies the threshold, calculating the multiplier value in view of the number of programming operations.

16. The system of claim 13, wherein to determine the configuration adjustment definition associated with one or more configuration setting values of the set of configuration setting values, the processing device is to perform further operations comprising:
determining a set of configuration adjustment definitions, wherein each configuration adjustment definition is associated with a corresponding configuration setting value of the set of configuration setting values; and
calculating the updated set of configuration setting values by applying the multiplier value to each configuration adjustment definition.

17. The system of claim 13, wherein the request comprises an identifier associated with the set of configuration setting values, and wherein the set of configuration values comprises a subset of a total number of configuration setting values for the memory device.

18. The system of claim 17, wherein the processing device is to perform further operations comprising:
determining the set of configuration setting values in view of the received identifier.

19. The system of claim 13, wherein the configuration adjustment definition is a polynomial equation comprising a plurality of operands, wherein a first operand of the plurality of operands comprises a default configuration setting value, wherein a second operand of the plurality of operand comprises an incremental change value associated with an expected slope of change for the configuration setting, and wherein the incremental change value is modified by the multiplier value.

* * * * *